(12) United States Patent
Schwandner et al.

(10) Patent No.: US 8,721,390 B2
(45) Date of Patent: May 13, 2014

(54) METHOD FOR THE DOUBLE-SIDE POLISHING OF A SEMICONDUCTOR WAFER

(75) Inventors: Juergen Schwandner, Garching (DE); Thomas Buschhardt, Burghausen (DE); Roland Koppert, Triftern (DE)

(73) Assignee: Siltronic AG, Munich (DE)

( * ) Notice: Subject to any disclaimer, the term of this patent is extended or adjusted under 35 U.S.C. 154(b) by 392 days.

(21) Appl. No.: 13/041,477

(22) Filed: Mar. 7, 2011

(65) Prior Publication Data
US 2011/0244762 A1    Oct. 6, 2011

(30) Foreign Application Priority Data
Mar. 31, 2010  (DE) .................. 10 2010 013 520

(51) Int. Cl.
*B24B 1/00* (2006.01)
(52) U.S. Cl.
USPC .............................. 451/41; 451/63; 438/692
(58) Field of Classification Search
USPC ............. 451/36, 41, 63, 260, 262, 268, 271; 438/692
See application file for complete search history.

(56) References Cited

U.S. PATENT DOCUMENTS

| | | |
|---|---|---|
| 4,655,191 A | 4/1987 | Wells |
| 5,287,774 A | 2/1994 | Seifert |
| 5,658,189 A | 8/1997 | Kagamida |
| 5,989,105 A | 11/1999 | Kawaguchi |
| 6,299,514 B1 | 10/2001 | Boller |
| 6,338,743 B1 | 1/2002 | Dusemund |
| 2001/0014570 A1 | 8/2001 | Wenski |
| 2001/0036797 A1* | 11/2001 | Fabry et al. ............... 451/41 |
| 2002/0077039 A1 | 6/2002 | Wenski |
| 2003/0045089 A1 | 3/2003 | Wenski |
| 2003/0104698 A1* | 6/2003 | Taniguchi et al. ............ 438/692 |
| 2008/0305722 A1 | 12/2008 | Roettger |
| 2009/0029552 A1 | 1/2009 | Schwandner |
| 2010/0048375 A1* | 2/2010 | Horie et al. ............... 501/11 |
| 2011/0183582 A1* | 7/2011 | Schwandner et al. ......... 451/41 |
| 2011/0244760 A1* | 10/2011 | Schwandner et al. ......... 451/36 |

FOREIGN PATENT DOCUMENTS

| | | |
|---|---|---|
| DE | 3942671 A1 | 6/1991 |
| DE | 19535616 B4 | 4/1996 |
| DE | 19817087 A1 | 11/1998 |
| DE | 19905737 A1 | 8/2000 |
| DE | 10007390 A1 | 10/2000 |
| DE | 10004578 C1 | 7/2001 |

(Continued)

*Primary Examiner* — Maurina Rachuba
(74) *Attorney, Agent, or Firm* — Leydig, Voit & Mayer, Ltd.

(57) ABSTRACT

A method for double-side polishing of a semiconductor wafer includes situating the semiconductor wafer in a cutout of a carrier that is disposed in a working gap between an upper polishing plate covered by a first polishing pad and a lower polishing plate covered by a second polishing pad. The first and second polishing pads each include tiled square segments that are formed by an arrangement of channels on the pads, where the square segments of the first pad are larger than the segments of the second pad. The square segments of the polishing pads include abrasives. During polishing, the carrier is guided such that a portion of the wafer temporarily projects laterally outside of the working gap. A polishing agent with a pH that is variable is supplied during polishing at a pH in a range of 11 to 12.5 during a first step and at a pH of at least 13 during a second step.

11 Claims, 2 Drawing Sheets

(56) References Cited

FOREIGN PATENT DOCUMENTS

| | | |
|---|---|---|
| DE | 10018338 C1 | 8/2001 |
| DE | 10122283 A1 | 8/2002 |
| DE | 102006048218 A1 | 4/2008 |
| DE | 102007035266 A1 | 1/2009 |
| EP | 522542 A1 | 1/1993 |
| EP | 1820603 A2 | 8/2007 |
| JP | 2004 71833 A | 9/2005 |
| JP | 2005305570 A | 11/2005 |
| JP | 2007083337 A | 4/2007 |
| JP | 2009011112 A | 1/2009 |

\* cited by examiner

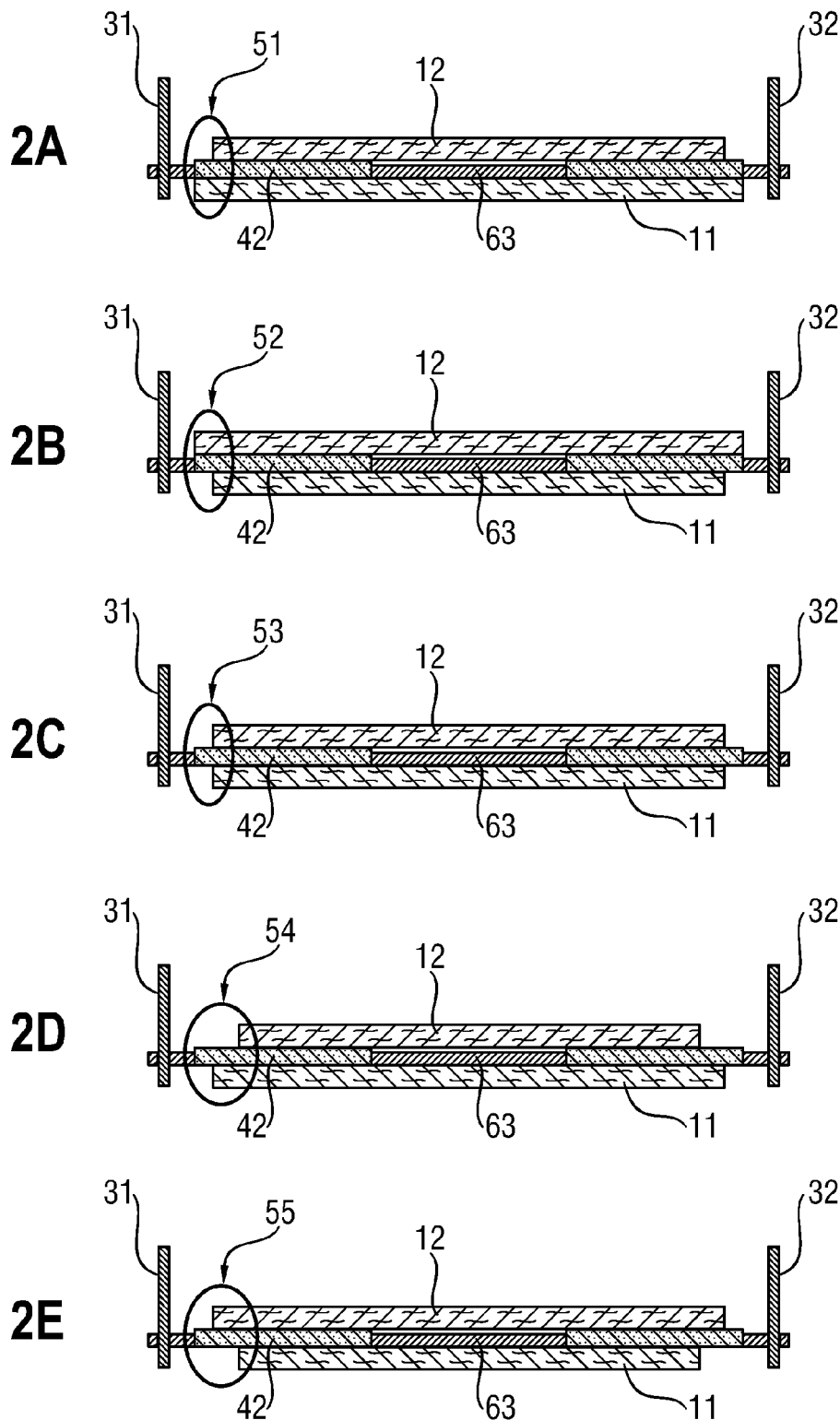

METHOD FOR THE DOUBLE-SIDE POLISHING OF A SEMICONDUCTOR WAFER

CROSS REFERENCE TO RELATED APPLICATIONS

This application claims priority to German Patent Application No. DE 10 2010 013 520.8, filed on Mar. 31, 2010, which is hereby incorporated by reference herein in its entirety.

FIELD

The invention relates to a method for the double-side polishing of a semiconductor wafer.

BACKGROUND

Conventionally, after grinding, cleaning and etching steps on a semiconductor wafer sliced from a single crystal, the surface of the semiconductor wafers is smoothed by polishing.

In the case of single-side polishing (or SSP for short), semiconductor wafers are held during processing on the rear side on a support plate using cement, by means of vacuum or by means of adhesion and are subjected to polishing on the other side.

In the case of double-side polishing (DSP), semiconductor wafers are introduced loosely into a thin carrier and are polished on the front and rear sides simultaneously in a manner "floating freely" between an upper and a lower polishing plate respectively covered with a polishing pad. This polishing method is effected with supply of a polishing agent slurry, normally generally on the basis of a silica sol. In the case of DSP, the front and rear sides of the semiconductor wafer are simultaneously polished at the same time.

A suitable double-side polishing machine is disclosed in DE 100 07 390 A1.

Polishing methods also include so-called polishing using fixedly bonded abrasives ("Fixed Abrasive Polishing", FAP), in which the semiconductor wafer is polished on a polishing pad which, in contrast to DSP or CMP polishing pads, contains an abrasive material bonded in the polishing pad ("Fixed Abrasive" or FA pad). The addition of a polishing agent slurry as in the case of DSP can be dispensed with, in principle, in the case of FAP.

The German Patent Application DE 102 007 035 266 A1 describes for example a method for polishing a substrate composed of silicon material, comprising two polishing steps using FA pads, which differ in that, in one polishing step, a polishing agent slurry containing non-bonded abrasive material as solid material is introduced between the substrate and the polishing pad, while in the second polishing step the polishing agent slurry is replaced by a polishing agent solution that is free of solid materials.

Following DSP or FAP, the front sides of the semiconductor wafers are generally polished in haze-free fashion. This is effected using a softer polishing pad with the aid of an alkaline polishing sol. This step is often referred to as CMP polishing in the literature. CMP methods are disclosed for example in US 2002-0077039 and also in US 2008-0305722.

In the case of DSP, the semiconductor wafers are situated in carriers which are usually thinner than the semiconductor wafers. DE 199 05 737 A1 claims a double-side polishing method in which the initial thickness of the semiconductor wafer is 20 to 200 µm greater than the carrier thickness. This is referred to as polishing the semiconductor wafer with an "overhang". The carriers during double-side polishing usually have a thickness of 400 to 1200 µm.

Usually, the polishing pad situated on the lower polishing plate is in contact with the front side of the semiconductor wafer to be polished, while the rear side of the semiconductor wafer touches the polishing pad situated on the upper polishing plate.

DE 100 04 578 C1 describes the use of different polishing pads for the upper and lower polishing plates. The polishing pad adhering to the upper polishing plate is pervaded with a network of channels, while the polishing pad adhering to the lower polishing plate does not have such texturing, but rather a smooth surface.

An improved distribution of the polishing agent used is achieved as a result of the texturing of the upper polishing pad. The supply of polishing agent is usually effected from the top toward the bottom. The polishing agent therefore flows through the channels of the upper polishing pad and then from the upper polishing pad through cutouts or openings in the carrier to the lower polishing pad or to the front side of the semiconductor wafer.

Moreover, the channels of the upper polishing pad prevent the rear side of the semiconductor wafer from adhering to the upper polishing pad. In accordance with DE 100 04 578 C1, the upper polishing pad comprises a regular checkered arrangement of channels having a segment size of 5 mm×5 mm to 50 mm×50 mm and a channel width and depth of 0.5 to 2 mm. With this arrangement, polishing is effected under a polishing pressure preferably of 0.1 to 0.3 bar.

However, a procedure in accordance with DE 100 04 578 C1 results in an asymmetrical polishing removal at the outer edge of the semiconductor wafer at the opposite sides (rear side and front side).

It has been found that a so-called edge roll-off (edge decrease with regard to the thicknesses) results, which is more pronounced at the front side of the semiconductor wafer than on the rear side.

SUMMARY

An aspect of the present invention is to avoid asymmetrical polishing removals in the edge region of the semiconductor wafer in the case of DSP.

In an embodiment, the present invention provides a method for double-side polishing of a semiconductor wafer including situating the semiconductor wafer in a cutout of a carrier that is disposed in a working gap between an upper polishing plate covered by a first polishing pad and a lower polishing plate covered by a second polishing pad. Each of the first and second polishing pads include a regular arrangement of channels having a width and a depth in a range of 0.5 to 2 mm. The channels form a tiled arrangement of square segments on the respective polishing pads. The square segments of the first polishing pad are greater than 20 mm×20 mm and the square segments of the second polishing pad are less than or equal to 20 mm×20 mm. The square segments of each of first and second polishing pads include abrasives of oxides of an element selected from the group consisting of silicon, aluminum and cerium having an average grain size in a range of 0.1 to 1.0 µm. The semiconductor wafer situated in the cutout is subjected to simultaneous double-side polishing while the carrier is guided such that a portion of the semiconductor wafer temporarily projects laterally outside of the working gap between the upper and lower polishing plates during the polishing. A polishing agent solution having a pH that is variable in a range of 11 to 13.5 in accordance with a corresponding supply of an alkaline component is supplied during the polishing. The supplying of the solution includes supplying a first portion of polishing agent solution having a pH in a range of 11 to 12.5 during a first step, and supplying a second portion of polishing agent solution having a pH of at least 13 in a second step.

BRIEF DESCRIPTION OF THE DRAWINGS

Exemplary embodiments of the present invention are described in more detail below with reference to the drawings, in which:

FIG. 2 shows embodiments of wafer excursion.

DETAILED DESCRIPTION

Figure 1:
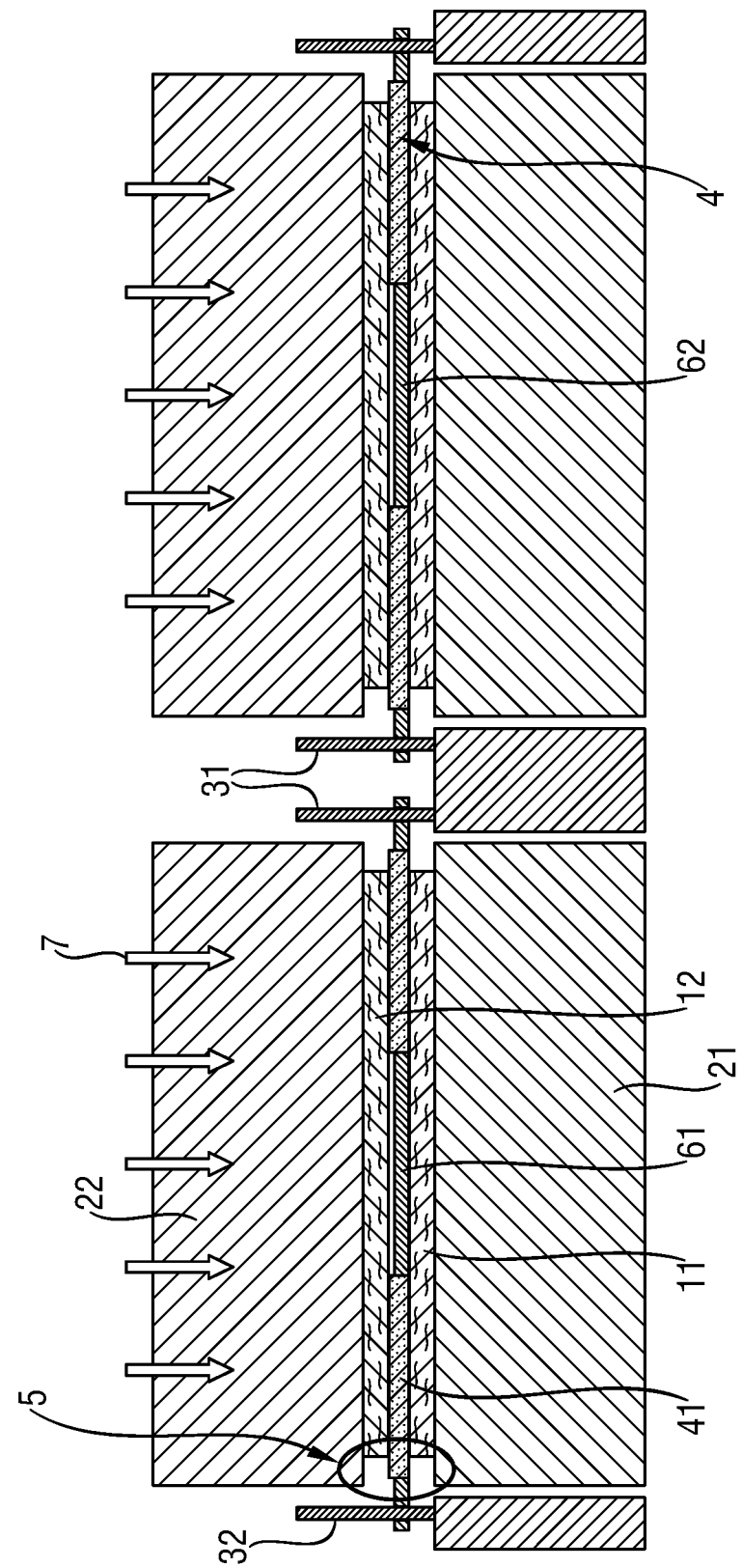
FIG. 1 schematically shows the construction for carrying out the method according to the invention.

In an embodiment the present invention provides double-side polishing using of specially prepared polishing pads containing fixedly bonded abrasives of oxides of an element selected from the group consisting of silicon, aluminum and cerium.

The polishing pads are cut to size such that a wafer excursion can be realized at the top and bottom. Wafer excursion means that the wafer, during polishing, temporarily projects with a part of its area from the working gap formed by the upper and lower polishing plates.

The upper and the lower polishing pads have different texturings. The pad situated on the upper polishing plate has segments of greater than 20 mm×20 mm, while the pad situated on the lower polishing plate has segments of less than or equal to 20 mm×20 mm. The lower polishing pad has smaller groove distances. The distance between two channels or grooves is given by the side length of a square segment.

Preferably, the groove edges are rounded toward the pad top side, that is to say have a specific radius of rounding, in order to prevent the "hard edges" that define the grooves from being projected onto the sides of the semiconductor wafer that are to be polished, primarily on the front side of said wafer. Such impression of the groove edges on the semiconductor surface could have a critical effect in respect of nanotopology.

The segments are provided by a regular arrangement of channels or grooves on a surface of the polishing pad. The channels are produced by means of suitable mechanical or chemical methods such as milling or etching, for example.

The pH value of the polishing agent solution supplied in the first part of the polishing process, said solution being free of solid materials is variable by virtue of the addition of the alkaline component being correspondingly controlled.

The removal rate is controlled by the variable pH value.

The aim is to produce a semiconductor wafer that is as flat as possible without wedge shape differences, without unevennesses in the edge region (edge roll-off).

Stopping the polishing process is carried out by increasing the pH value of the alkaline polishing agent solution to 13 or higher.

The surface roughness of the semiconductor wafer is reduced in this stopping step. This concerns, in particular, the long-wave surface roughness.

Apart from the different structuring, the two polishing pads can have the same material-specific properties.

The polishing pad preferably comprises a thermoplastic or heat-curable polymer.

A multiplicity of substances may be envisaged for the material, e.g. polyurethanes, polycarbonate, polyamide, polyacrylate, polyester, etc.

The polishing pad preferably comprises solid, microporous polyurethane.

It is also preferred to use polishing pads composed of foamed plates or felt or fiber substrates, which are impregnated with polymers.

The abrasives contained in both polishing pads are situated on the segments, that is to say on the elevations between the grooves or channels.

The abrasives are preferably oxides of silicon, in particular $SiO_2$.

The double-side polishing is effected by means of planetary kinematics. This means that the semiconductor wafer lies in freely movable fashion in a cutout in a carrier that is caused to rotate by means of a rolling apparatus, and is thereby moved on a cycloidal trajectory, while the semiconductor wafer is polished between the upper and lower polishing plates.

The invention makes it possible to obtain an optimum edge geometry (edge roll-off) on the front and rear sides of the semiconductor wafer. It has been found that the non-uniform polishing removals observed in the prior art in the edge region of the semiconductor wafer can be completely avoided by means of the method according to the invention.

The method according to the invention makes it possible to obviate silica sol used in conventional DSP.

The front and rear sides of the semiconductor wafer can be simultaneously polished at the same time.

Conventional DSP polishing machines are suitable for this purpose, wherein the polishing pads used contain abrasives and the upper and lower polishing pads are structured differently.

During the polishing step, a polishing agent solution that is free of solid materials is introduced between the sides of the semiconductor wafer that are to be polished and the two polishing pads.

The polishing agent solution comprises water, but preferably deionized water (DIW) having the purity customary for use in the semiconductor industry. The polishing agent solution furthermore preferably contains compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH), or any desired mixtures thereof.

The use of potassium carbonate is especially preferred.

The pH value of the polishing agent solution lies in a range of 11 to approximately 13.5 and is varied by corresponding addition of the stated compounds in this pH value range.

The proportion of the stated compounds such as potassium carbonate, for example, in the polishing agent solution is preferably 0.01 to 10% by weight.

A polishing agent solution having a pH of 11-12.5 is supplied in a first step.

In this step, the material removal is effected on both sides of the semiconductor wafer.

A polishing agent solution having a pH value of greater than or equal to 13 is supplied in a second step. The material removal is thereby stopped.

Preferably, a polishing agent solution having a pH value of less than or equal to 11.5 is supplied in a third step. Such a step serves to prepare for the preferably subsequent polishing with supply of a polishing agent slurry.

Specifically, the method preferably furthermore comprises a simultaneous double-side polishing of the semiconductor wafer on the same polishing pads, in the case of which, instead of the polishing agent solution, a polishing agent slurry is supplied, comprising abrasives of oxides of an element selected from the group consisting of silicon, aluminum and cerium, wherein a polishing agent slurry having an average size of the abrasives of 15-30 nm is used in a first step and a polishing agent slurry having an average size of the abrasives that is greater than the average abrasive size of the polishing agent slurry used in the first step, of preferably 35-70 mm, is used in a second step.

This additional polishing serves firstly for reducing the micro damage induced by the FAP polishing and secondly for minimizing defects and scratches and for reducing the short-wave surface roughnesses.

A polishing agent slurry containing abrasives is supplied during this additional simultaneous double-side polishing.

The size distribution of the abrasive material particles is preferably monomodal in nature.

The abrasive material comprises a material that mechanically removes the substrate material, preferably one or more of the oxides of the elements aluminum, cerium or silicon.

The proportion of the abrasive material in the polishing agent slurry is preferably 0.25 to 20% by weight, particularly preferably 0.25 to 1% by weight.

The use of colloidally disperse silica as polishing agent slurry is particularly preferred.

By way of example, the aqueous polishing agents Levasil® (colloidal silica particles in an aqueous solution) from H. C. Starck and Glanzox 3900® (silica dioxide in solution including ammonia and water) from Fujimi can be employed. Levasil® is a registered trademark of Bayer AG, Leverkusen, license held by H. C. Starck GmbH.

The average particle size of Levasil® is 5-75 nm depending on the type. The use of Levasil® is therefore suitable for both polishing steps, wherein Levasil® having particle sizes of 15-30 nm is used in the first step and Levasil® having particle sizes of 35-70 nm is used in the second step.

Glanzox 3900® is the product name for a polishing agent slurry offered as a concentrate by Fujimi Incorporated, Japan. The base solution of this concentrate has a pH value of 10.5 and contains approximately 9% by weight of colloidal $SiO_2$.

The polishing agent preferably contains additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH).

However, the polishing agent slurry can contain one or more further additives, for example surface-active additives such as wetting agents and surfactants, stabilizers acting as protective colloids, preservatives, biocides, alcohols and complexing agents.

Preferably, but not necessarily, some other type of polishing agent feed or supply is used in the method according to the invention. The lower polishing plate is supplied with fresh polishing agent independently of the upper polishing plate. For this purpose, the lower polishing plate likewise provides a polishing agent feedthrough and also a separate polishing agent conveying system.

The polishing machine AC2000 from Peter Wolters, Rendsburg (Germany) is particularly suitable for carrying out the method according to the invention.

Said polishing machine is equipped with pin interlocking of the outer and inner rings in order to drive the carriers. The apparatus can be designed for one or more carriers. Owing to the higher throughput, an apparatus for a plurality of carriers is preferred, such as is described for example in DE 100 07 390 A1 and in which the carriers move on a planetary path around the center of the apparatus. The apparatus includes a lower and an upper polishing plate, which are freely rotatable horizontally and are covered with a polishing pad. During the polishing, the semiconductor wafers are situated in the cutouts in the carriers and between the two polishing plates, which rotate and exert a specific polishing pressure on them while a polishing agent (slurry or solution) is continuously supplied. In this case, the carriers are also set in motion, preferably by means of rotating pin rings which engage in teeth on the circumference of the carriers.

A typical carrier comprises cutouts for receiving three semiconductor wafers. Situated on the circumference of the cutouts are inlays or so-called carrier moldings which are intended to protect the fracture-sensitive edges of the semiconductor wafers, in particular including against metals being released from the carrier body.

The carrier body can comprise for example metal, ceramic, plastic, fiber-reinforced plastic, or metal coated with plastic or with a diamond-like carbon layer (DLC layer). Steels are preferred, however, stainless chromium steel being particularly preferred.

The cutouts are preferably designed for receiving an odd number of semiconductor wafers having a diameter of at least 200 mm, preferably 300 mm, especially preferably 450 mm, and thicknesses of 500 to 1000 µm.

FIG. 1 schematically shows semiconductor wafers 4 in cutouts in carriers 61 and 62, which are moved by means of inner toothed ring 31 and outer toothed ring 32. Polishing pad 11 is situated on lower polishing plate 21. Polishing pad 12 is situated on upper polishing plate 22. Polishing plate 22 is pressed with polishing pad 12 with the direction of the polishing/contact pressure 7 against carriers 61 and 62, semiconductor wafers 4 and lower polishing plate 21 with polishing pad 11. Semiconductor wafer 41 projects beyond the boundaries of polishing pads 11 and 12 (excursion 5).

FIG. 2 shows embodiments of the excursion.

2A shows semiconductor wafer 42 in carrier 63 with lower polishing pad 11 and upper polishing pad 12 between inner toothed ring 31 and outer toothed ring 32. Semiconductor wafer 42 projects beyond the upper polishing pad 12 (excursion 51).

2B shows semiconductor wafer 42 in carrier 63 with lower polishing pad 11 and upper polishing pad 12 between inner toothed ring 31 and outer toothed ring 32. Semiconductor wafer 42 projects beyond the lower polishing pad 11 (excursion 52).

2C shows semiconductor wafer 42 in carrier 63 with lower polishing pad 11 and upper polishing pad 12 between inner toothed ring 31 and outer toothed ring 32. Semiconductor wafer 42 projects beyond the upper polishing pad 12 and beyond the lower polishing pad 11 (excursion 53).

2D shows semiconductor wafer 42 in carrier 63 with lower polishing pad 11 and upper polishing pad 12 between inner toothed ring 31 and outer toothed ring 32. Semiconductor wafer 42 projects beyond the upper polishing pad 12 and beyond the lower polishing pad 11. Excursion 54 is more pronounced with respect to the upper polishing pad 12.

2E shows semiconductor wafer 42 in carrier 63 with lower polishing pad 11 and upper polishing pad 12 between inner toothed ring 31 and outer toothed ring 32. Semiconductor wafer 42 projects beyond the upper polishing pad 12 and beyond the lower polishing pad 11. Excursion 55 is more pronounced with respect to the lower polishing pad 11.

An explanation is given below of how the double-side polishing according to the invention can preferably be integrated into a manufacturing sequence for producing semiconductor wafers.

Firstly, a semiconductor wafer is sliced from a single crystal composed of semiconductor material grown by means of CZ or FZ. The semiconductor wafer is preferably sliced using a wire saw. The slicing of the semiconductor wafer by means of a wire saw is effected in the manner known e.g. from U.S. Pat. No. 4,655,191, EP 522 542 A1, DE 39 42 671 A1 or EP 433 956 A1, which are hereby incorporated by reference herein.

The grown single crystal composed of semiconductor material is preferably a single crystal composed of silicon. The semiconductor wafer is preferably a monocrystalline silicon wafer.

Before the polishing, the following procedure is preferably adopted:

Firstly, a semiconductor wafer is sliced from a single crystal composed of semiconductor material grown by means of CZ or FZ. The semiconductor wafer is preferably sliced using a wire saw. The slicing of the semiconductor wafer by means of a wire saw is effected in the manner known e.g. from U.S. Pat. No. 4,655,191, EP 522 542 A1, DE 39 42 671 A1 or EP 433 956 A1, which are hereby incorporated by reference herein.

The grown single crystal composed of semiconductor material is preferably a single crystal composed of silicon. The semiconductor wafer is preferably a monocrystalline silicon wafer.

Processes for processing the edge of the semiconductor wafer and also the two surfaces subsequently take place.

The edge of the semiconductor wafer is preferably rounded using a coarse abrasive.

For this purpose, the semiconductor wafer is fixed on a rotating table and delivered by its edge against the likewise rotating working surface of a processing tool. The processing tools used in this case can be embodied as disks which are secured to a spindle and have circumferential surfaces serving as working surfaces for processing the edge of the semiconductor wafer.

An apparatus suitable for this purpose is disclosed in DE 195 35 616 A1, for example, which is hereby incorporated by reference herein.

Preferably, the semiconductor wafers are provided with a profile that is symmetrical with respect to the central plane of the wafer, with facets of identical type on the front side of the wafer and the rear side of the wafer or else with an asymmetrical edge profile with different facet widths on the front and rear sides. In this case, the edge of the semiconductor wafer acquires a profile that is geometrically similar to a target profile.

The grinding disk used preferably has a grooved profile. A preferred grinding disk is disclosed in DE 102 006 048 218 A1, which is hereby incorporated by reference herein.

The working surfaces can also be embodied in the form of an abrasive cloth or as an abrasive belt.

The material-removing grain, preferably diamond, can be fixedly anchored in the working surfaces of the processing tools.

The grain used preferably has a coarse granulation. According to JIS R 6001:1998, the granulation (in mesh) is #240-#800.

The average grain size is 20-60 µm, preferably 25-40 µm, especially preferably 25-30 µm or 30-40 µm.

The edge rounding is preferably followed by double-side material-removing processing of the semiconductor wafer sliced from a single crystal, using a coarse abrasive.

PPG (Planetary Pad Grinding), for example, is suitable for this purpose.

PPG is a method for the simultaneous double-side grinding of a plurality of semiconductor wafers, wherein each semiconductor wafer lies in freely movable fashion in a cutout in one of a plurality of carriers that are caused to rotate by means of a rolling apparatus, and is thereby moved on a cycloidal trajectory, wherein the semiconductor wafers are processed in material-removing fashion between two rotating working disks, wherein each working disk comprises a working layer containing bonded abrasive. A method with planetary kinematics such as DSP is involved.

A hard material having a Mohs hardness of ≥6 is preferred as abrasive bonded in the working layers. Appropriate abrasive materials are preferably diamond, silicon carbide (SiC), cerium dioxide ($CeO_2$), corundum (aluminum oxide, $Al_2O_3$), zirconium dioxide ($ZrO_2$), boron nitride (BN; cubic boron nitride, CBN), furthermore silicon dioxide ($SiO_2$), boron carbide ($B_4C$) through to significantly softer materials such as barium carbonate ($BaCO_3$), calcium carbonate ($CaCO_3$) or magnesium carbonate ($MgCO_3$). Diamond, silicon carbide (SiC) and aluminum oxide ($Al_2O_3$; corundum) are particularly preferred, however.

The average grain size of the abrasive is 5-20 µm, preferably 5-15 µm and especially preferably 5-10 µm.

The abrasive particles are preferably bonded individually or as clusters in the bonding matrix of the working layer. In the case of cluster bonding, the grain diameters specified as preferred relate to the primary particle size of the cluster constituents.

Preferably, a second PPG grinding of the semiconductor wafer is subsequently effected, wherein an abrasive cloth having finer granulation than before is used.

The average grain size of the abrasive is in this case 0.5-10 µm, preferably 0.5-7 µm, particularly preferably 0.5-4 µm and especially preferably 0.5-2 µm.

This can be followed by a second edge rounding using a finer abrasive.

A grinding tool having finer granulation is therefore used during the second edge rounding.

For this purpose, the semiconductor wafer is once again fixed on a rotating table and delivered by its edge against the likewise rotating working surface of a processing tool. The processing tools used in this case can be embodied as disks which are secured to a spindle and have circumferential surfaces serving as working surfaces for processing the edge of the semiconductor wafer.

The working surfaces can also be embodied in the form of an abrasive cloth or as an abrasive belt.

The material-removing grain, preferably diamond, can be fixedly anchored into the working surfaces of the processing tools.

The grain used has a fine granulation. According to JIS R 6001:1998, the granulation should be finer than #800, preferably #800-#8000. The average grain size is 0.5-20 µm, preferably 0.5-15 µm, particularly preferably 0.5-10 µm, and especially preferably 0.5-5 µm.

In a further step, both sides of the semiconductor wafer can be treated with an etching medium in conjunction with a material removal of not more than 1 µm per side of the semiconductor wafer.

The minimum material removal per side of the semiconductor wafer is preferably 1 monolayer, that is to say approximately 0.1 nm.

The semiconductor wafer is preferably subjected to a wet-chemical treatment with an acidic medium.

Suitable acidic media include aqueous solutions of hydrofluoric acid, nitric acid or acetic acid.

The cleaning and etching methods described are preferably effected as single-wafer treatment.

The double-side polishing in accordance with the method according to the invention is thereupon effected.

The front and rear sides of the semiconductor wafer are simultaneously polished at the same time.

Conventional DSP polishing machines are suitable for this purpose, wherein the polishing pads used are configured according to the invention. After the double-side polishing according to the invention, the edge of the semiconductor wafer is preferably polished.

Commercially available automatic edge-polishing units are suitable for this purpose.

U.S. Pat. No. 5,989,105 discloses such an apparatus for edge polishing, wherein the polishing drum is composed of an aluminum alloy and has a polishing pad applied to it.

The semiconductor wafer is usually fixed on a flat wafer holder, a so-called chuck. The edge of the semiconductor wafer projects beyond the chuck, such that it is freely accessible for the polishing drum. A centrally rotating polishing drum, to which the polishing pad is applied and which is inclined by a specific angle with respect to the chuck, and the chuck with the semiconductor wafer are delivered to one another and pressed onto one another with a specific contact pressure while the polishing agent is continuously supplied.

During the edge polishing, the chuck with the semiconductor wafer held thereon is rotated centrally.

Preferably, one revolution of the chuck lasts 20-300 s, particularly preferably 50-150 s (revolution time).

A polishing drum, which is covered with the polishing pad and is preferably rotated centrally at a rotational speed of 300-1500 $\min^{-1}$, particularly preferably 500-1000 $\min^{-1}$, and the chuck are delivered to one another, with the polishing drum being set obliquely at a setting angle with respect to the semiconductor wafer and the semiconductor wafer being fixed on the chuck in such a way that it projects slightly beyond the latter and is therefore accessible for the polishing drum.

The setting angle is preferably 30-50°.

Semiconductor wafer and polishing drum are pressed onto one another with a specific contact pressure and with a polishing agent being supplied continuously, preferably with a polishing agent flow rate of 0.1-1 liter/min, particularly preferably 0.15-0.40 liter/min, wherein the contact pressure can be set by means of weights attached to rolls and is preferably 1-5 kg, particularly preferably 2-4 kg.

Polishing drum and semiconductor wafer are preferably moved away from one another after 2-20, particularly preferably after 2-8, revolutions of the semiconductor wafer or of the chuck holding the semiconductor wafer.

The polishing pad used during the edge polishing can have fixedly bonded abrasives applied to it (FAP polishing pad). In this case, the polishing is effected with the continuous supply of a polishing agent solution containing no solid materials.

The abrasive material is composed of a material that mechanically removes the substrate material, preferably one or more of the oxides of the elements aluminum, cerium or silicon.

A short polishing step using softly removing silica sol (e.g. Glanzox) can additionally follow on the same FAP polishing pad in order to realize a reduction of the edge roughness and edge defect rates.

Finally, preferably a chemical mechanical polishing (CMP) of at least the front side of the semiconductor wafer is effected.

Preferably, both sides of the semiconductor wafer are polished by means of CMP in this step. A conventional DSP polishing machine is suitable for this purpose, in which machine, however, softer CMP polishing pads are used instead of the conventional DSP removal polishing pads.

While the invention has been particularly shown and described with reference to preferred embodiments thereof, it will be understood by those skilled in the art that various changes in form and details may be made therein without departing from the spirit and scope of the invention.

LIST OF REFERENCE SYMBOLS

11 Polishing pad on lower polishing plate
12 Polishing pad on upper polishing plate
21 Lower polishing plate
22 Upper polishing plate
31 Inner toothed ring
32 Outer toothed ring
4 Semiconductor wafer(s)
5 Excursion
6 Carrier(s)
7 Polishing/contact pressure

What is claimed is:

1. A method for double-side polishing of a semiconductor wafer comprising:
situating the semiconductor wafer in a cutout of a carrier that is disposed in a working gap between an upper polishing plate covered by a first polishing pad and a lower polishing plate covered by a second polishing pad, each of the first and second polishing pads including a regular arrangement of channels having a width and a depth in a range of 0.5 to 2 mm, the channels forming a tiled arrangement of square segments on the respective polishing pads, the square segments of the first polishing pad being greater than 20 mm×20 mm and the square segments of the second polishing pad being less than or equal to 20 mm×20 mm, the square segments of each of first and second polishing pads including abrasives of oxides of an element selected from the group consisting of silicon, aluminum and cerium having an average grain size in a range of 0.1 to 1.0 μm;
simultaneous double-side polishing the semiconductor wafer situated in the cutout and guiding the carrier such that a portion of the semiconductor wafer temporarily projects laterally outside of the working gap between the upper and lower polishing plates during the polishing; and
supplying a polishing agent solution during the polishing, the polishing agent solution having a pH that is variable in a range of 11 to 13.5 in accordance with a corresponding supply of an alkaline component, the supplying of the polishing agent solution including:
supplying a first portion of polishing agent solution having a pH in a range of 11 to 12.5 during a first step, and
supplying a second portion of polishing agent solution having a pH of at least 13 in a second step.

2. The method as recited in claim 1, wherein the supplying of the polishing agent solution further includes supplying a third portion of polishing agent solution having a pH less than or equal to 11.5 in a third step.

3. The method as recited in claim 1, further comprising additional double-side polishing of the semiconductor wafer using the first and second polishing pads including supplying a polishing agent slurry is comprising abrasives of oxides of an element selected from the group consisting of silicon, aluminum and cerium, the supplying of the polishing agent slurry including:
supplying a first portion of polishing agent slurry including abrasives having an average particles size in a range of 15 to 30 nm during a first slurry-polishing step, and
supplying a second portion of polishing agent slurry including abrasives having an average particle size in a range of 37-70 nm during a second slurry-polishing step.

4. The method as recited in claim 2, further comprising additional double-side polishing of the semiconductor wafer using the first and second polishing pads including supplying a polishing agent slurry is comprising abrasives of oxides of an element selected from the group consisting of silicon, aluminum and cerium, the supplying of the polishing agent slurry including:
- supplying a first portion of polishing agent slurry including abrasives having an average particles size in a range of 15 to 30 nm during a first slurry-polishing step, and
- supplying a second portion of polishing agent slurry including abrasives having an average particle size in a range of 37-70 nm during a second slurry-polishing step.

5. The method as recited in claim 1, wherein the supplying the polishing agent solution includes:
- supplying the polishing agent solution to a top of the semiconductor wafer, and
- supplying the polishing agent solution to a bottom of the semiconductor wafer independent from the supply of polishing agent solution to the top of the semiconductor wafer.

6. The method as recited in claim 3, wherein at least one of the supplying the polishing agent solution and the supplying the polishing agent slurry includes:
- supplying the respective polishing agent to a top of the semiconductor wafer, and
- supplying the respective polishing agent to a bottom of the semiconductor wafer independent from the supply of polishing agent to the top of the semiconductor wafer.

7. The method as recited in claim 4, wherein at least one of the supplying the polishing agent solution and the supplying the polishing agent slurry includes:
- supplying the respective polishing agent to a top of the semiconductor wafer, and
- supplying the respective polishing agent to a bottom of the semiconductor wafer independent from the supply of polishing agent to the top of the semiconductor wafer.

8. The method as recited in claim 1, wherein an initial thickness of the semiconductor wafer is greater than a thickness of the carrier.

9. The method as recited in claim 7, wherein an initial thickness of the semiconductor wafer is greater than a thickness of the carrier.

10. The method as recited in claim 1, the channels of each of the first and second polishing pads include rounded edges at a transition of the pad top side to the respective channel.

11. The method as recited in claim 9, the channels of each of the first and second polishing pads include rounded edges at a transition of the pad top side to the respective channel.

* * * * *